(12) United States Patent
Chen

(10) Patent No.: US 6,172,403 B1
(45) Date of Patent: Jan. 9, 2001

(54) ELECTROSTATIC DISCHARGE PROTECTION CIRCUIT TRIGGERED BY FLOATING-BASE TRANSISTOR

(75) Inventor: Wei-Fan Chen, Taichung (TW)

(73) Assignee: Winbond Electronics Corp., Hsinchu (TW)

(*) Notice: Under 35 U.S.C. 154(b), the term of this patent shall be extended for 0 days.

(21) Appl. No.: 09/212,317

(22) Filed: Dec. 15, 1998

(51) Int. Cl.[7] .............................. H01L 23/42; H01L 21/38; H01L 23/60
(52) U.S. Cl. .......................... 257/355; 257/356; 257/357
(58) Field of Search .................................... 257/355, 356, 257/357

(56) References Cited

U.S. PATENT DOCUMENTS

| | | | |
|---|---|---|---|
| 5,012,317 | * | 4/1991 | Rountre . |
| 5,465,189 | * | 11/1995 | Polgreen et al. . |
| 5,719,733 | * | 2/1998 | Wei et al. . |
| 5,742,084 | * | 4/1998 | Yu . |
| 5,856,214 | * | 1/1999 | Yu . |
| 5,932,916 | * | 8/1999 | Jurg . |
| 6,066,879 | * | 5/2000 | Lee et al. . |

* cited by examiner

Primary Examiner—Stephen D. Meier
(74) Attorney, Agent, or Firm—Ladad & Parry

(57) ABSTRACT

An electrostatic discharge protection circuit triggered by a transistor having a floating base is disclosed. The electrostatic discharge protection circuit in accordance with the present invention comprises: an N-type semiconductor layer, a floating P-type semiconductor layer, a first P-type doped region, a first N-type doped region, a second N-type doped region, and a third N-type doped region. The floating P-type semiconductor layer is in contact with the N-type semiconductor layer so as to establish a junction there between. The first P-type doped region and the first N-type doped region are formed in the N-type semiconductor layer, both of which are connected to a first node. The second N-type doped region is formed in the P-type semiconductor layer and connected to a second node, while the third N-type doped region spans the junction. In addition, there is formed a gate structure overlying a portion of the P-type semiconductor layer between the second and third N-type doped regions.

11 Claims, 5 Drawing Sheets

ELECTROSTATIC DISCHARGE PROTECTION CIRCUIT TRIGGERED BY FLOATING-BASE TRANSISTOR

BACKGROUND OF THE INVENTION

1. Field of the Invention

The present invention relates to electrostatic discharge protection techniques for semiconductor integrated circuitry. More particularly, the present invention relates to an electrostatic discharge protection circuit triggered by a floating-base transistor.

2. Description of the Related Art

Electrostatic discharge, ESD hereinafter, may occur everywhere during the phases of testing, assembly, installation, operation, etc., and cause damage to integrated circuits (ICs). Nowadays, several models have been propounded to simulate ESD events, wherein a so-called Human Body Model is generally used to evaluate ESD immunity for integrated circuits because it has a longer ESD pulse period.

Sub-micron CMOS ICs have become increasingly vulnerable to ESD damage due to advanced processes, such as the use of lightly-doped drain structures and clad silicide diffusions. Conventionally, lateral silicon-controlled rectifiers (LSCRs) have been disclosed (for example, in U.S. Pat. No. 5,012,317) as ESD protection circuits for shunting ESD stress. However, the triggering of the conventional lateral silicon-controlled rectifier to activate and thus bypass the ESD stress relies heavily on the P/N junction breakdown between a substrate and a well region formed therein. Due to the fact that both of the substrate and well region are generally provided with a low doping concentration, the trigger voltage of the lateral silicon-controlled rectifier can be up to 30V or more, at which point the ICs may have been adversely affected.

To lower the trigger voltage, U.S. Pat. No. 5,465,189 has disclosed "A LOW VOLTAGE TRIGGERING SEMICONDUCTOR CONTROLLED RECTIFIER" as illustrated in FIG. 1. In the drawing, the SCR is fabricated onto a P-type semiconductor substrate 10, in a predetermined portion of which an N-well region 11 is formed. A P-type doped region 12 and an N-type doped region 13 are formed within the extent of the N-well region 11 and spaced apart from each other, while an N-type doped regions 14 and a P-type doped region 15 are formed within the extent of the P-type semiconductor substrate 10 and spaced apart from each other. The P-type doped region 12 and the N-type doped region 13 are connected together to an IC pad 1. The IC pad 1 is electrically connected to an internal circuit 2, which is vulnerable to ESD damage and should be protected by the lateral silicon-controlled rectifier. In addition, the N-type doped region 14 and the P-type doped region 15 are connected together to a potential node $V_{SS}$, which is generally connected to a ground under normal operation.

Moreover, an N-type doped region 16 is a heavily-doped region, having one portion formed in the N-well region 11 and another portion formed in the P-type semiconductor substrate 10. In other words, the N-type doped region 16 stretches across the P/N junction between the N-well region 11 and the P-type seumconductor substrate 10. Furthermore, a gate structure 17 for this conventional ESD protection circuit is provided from bottom to top, with a gate dielectric layer 18 and a gate electrode layer 19 connected to the $V_{SS}$ node to overlie a portion of the semiconductor substrate 10 between the N-type doped region 14 and 16.

Correspondingly, the P-type doped region 12, the N-well region 11, and the P-type semiconductor substrate 10 serve as the emitter, base, and collector, respectively, of a PNP bipolar junction transistor 20, while the N-well well region 11, the P-type semiconductor substrate 10, and the N-type doped region 14 serve as the collector, base, and emitter, respectively, of an NPN bipolar junction transistor 21. Referring to FIG. 2, the equivalent circuit diagram of the conventional lateral silicon-controlled rectifier of FIG. 1 is schematically depicted. In the drawing, resistors 22 and 23 designate the respective spreading resistance of the N-well region 11 and the P-type semiconductor substrate 10. Reference numeral 24 represents a metal-oxide-semiconductor field-effect transistor (MOSFET) constituted by the N-type doped regions 14 and 16, the portion of the semiconductor substrate 10 there between, and the gate structure 17.

The conventional ESD protection circuit shown in FIG. 1 has a relatively low trigger voltage but consumes a greater amount of layout area. Moreover, as integrated circuit fabrication advances into the deep sub-micron era, the resistance of the substrate is decreasing, making it more difficult for ESD protection circuits to be triggered.

SUMMARY OF THE INVENTION

It is therefore an object of the present invention to provide an electrostatic discharge protection circuit triggered by a floating-base transistor at a decreased trigger voltage suitable for deep sub-micron ICs.

It is another object of the present invention to provide an electrostatic discharge protection circuit occupying less layout area.

The present invention achieves the above-indicated objects by providing an electrostatic discharge protection circuit triggered by a transistor having a floating base. The electrostatic discharge protection circuit comprises: an N-type semiconductor layer, a floating P-type semiconductor layer, a first P-type doped region, a first N-type doped region, a second N-type doped region, and a third N-type doped region. The floating P-type semiconductor layer is in contact with the N-type semiconductor layer so as to establish a junction there between. The first P-type doped region and the first N-type doped region are formed in the N-type semiconductor layer, both of which are connected to a first node. The second N-type doped region is formed in the P-type semiconductor layer and connected to a second node, while the third N-type doped region spans the junction. In addition, there is formed a gate structure overlying a portion of the P-type semiconductor layer between the second and third N-type doped regions.

According to the present invention, the lateral silicon-controlled rectifier provided with an NPN bipolar junction transistor having a floating base can be triggered at a decreased voltage while consuming less layout area.

BRIEF DESCRIPTION OF DRAWINGS

The following detailed description, given by way of examples and not intended to limit the invention to the embodiments described herein, will best be understood in conjunction with the accompanying drawings, in which.

DETAILED DESCRIPTION OF THE INVENTION

According to the present invention, an ESD protection circuit comprises a MOS transistor, a PNP bipolar junction transistor, and a floating-base NPN bipolar junction transistor, thereby decreasing its trigger voltage to bypass ESD stress and reducing the required layout area.

Figure 3:
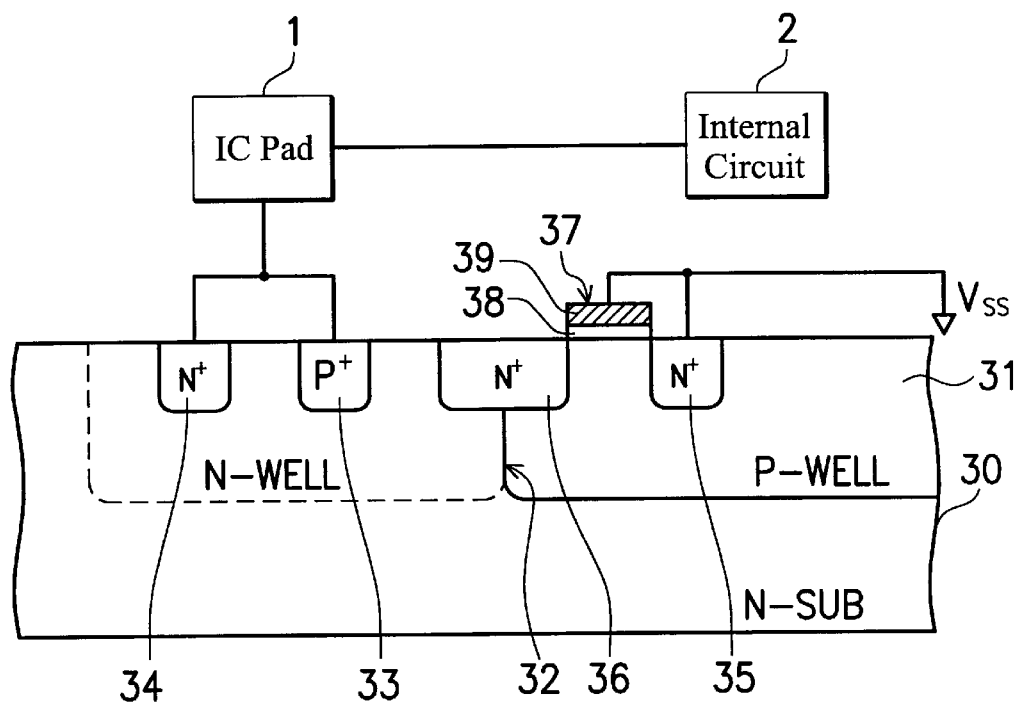
FIG. 3 depicts a cross-sectional view of a first preferred embodiment of the present invention fabricated onto a semiconductor substrate.

Referring to FIG. 3, a cross-sectional view of a first preferred embodiment of the present invention fabricated onto a semiconductor substrate is depicted. In FIG. 3, an N-type semiconductor layer 30 and a P-type semiconductor layer 31 are provided in contact with each other to establish a P/N junction 32. For instance, the N-type semiconductor layer 30 can be an N-type silicon substrate or an N-well region formed in a silicon substrate, while the P-type semiconductor layer 31 is a P-well region formed in thus substrate. A first P-type doped region 33 and a first N-type doped region 34 are formed within the extent of the N-type semiconductor layer 30, when a second N-type doped region 35 is formed within the extent of the P-type semiconductor layer 31. Both the first P-type doped region 33 and the first N-type doped region 34 are connected to the IC pad 1, which is coupled to the internal circuit 2. The internal circuit 2 represents a circuit portion that is vulnerable to ESD damage and should be protected by a protection circuit. The second N-type doped region 34 is connected to a potential node $V_{SS}$, which is powered to ground under normal operation.

In addition, a third N-type doped region 36 spans the P/N junction 32 by way of a portion formed in the N-type semiconductor layer 30 and another portion formed in the P-type semiconductor layer 31. A gate structure 37 overlies a portion of the P-type semiconductor layer 31 between the N-type doped regions 36 and 35. From bottom to top, the gate structure 37 comprises a dielectric layer 38 overlying the portion of the P-type semiconductor layer between the N-type doped regions 35 and 36, and a electrode layer 39 formed on the dielectric layer 38 and connected to the $V_{SS}$ node. Preferably, the dielectric layer 38 is a thermally-grown silicon oxide layer, and the electrode layer 39 is an LPCVD-deposited polysilicon layer.

Figure 4:
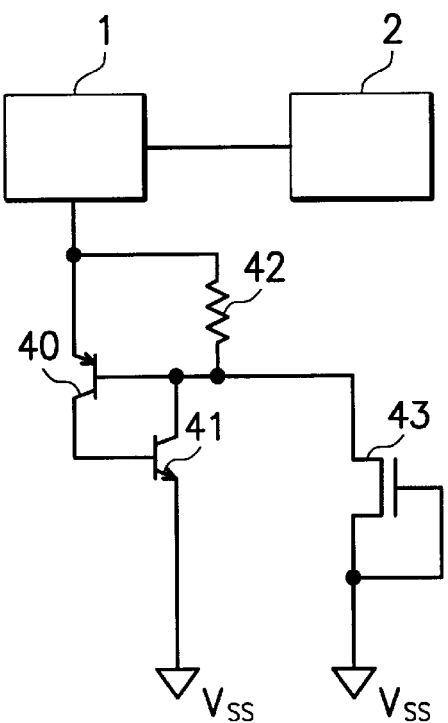
FIG. 4 schematically depicts an equivalent circuit diagram of FIG. 3.

Thus, the first P-type doped region 33, the N-type semiconductor layer 30, and the P-type semiconductor layer 31 constitutes the emitter, base, and collector of a PNP bipolar junction transistor 40, while the N-type semiconductor layer 30, the P-type semiconductor layer 31, and the second N-type doped region 35 constitute the collector, base, and emitter of an NPN bipolar junction transistor 41. Therefore, the PNP bipolar junction transistor 40 and the NPN bipolar junction transistor 41 constitute a silicon-controlled rectifier. Moreover, the N-type doped regions 35 and 36, the portion of the P-type semiconductor layer 31 there between, and the gate structure 37 constitute a metal-oxide-semiconductor field-effect transistor (MOSFET) 43. The equivalent circuit diagram of FIG. 3 is schematically shown in FIG. 4. In the drawing, reference numeral 42 designates the spreading resistance of the N-type semiconductor layer 30.

As to the ESD protection circuit of the present invention, there is no contact region provided in the P-type semiconductor layer 31 that is in a floating state. When occurring to the IC pad 1, ESD stress immediately boosts the potential of the P-type semiconductor layer 31 so as to forward bias the junction between the P-type semiconductor layer 31 and the second N-type doped region 35. In other words, the base-emitter junction of the NPN bipolar junction transistor 41 is forward biased, thereby conducting a discharge current through the silicon-controlled rectifier having the PNP bipolar junction transistor 40 and the NPN bipolar junction transistors 41 in order to bypass the ESD pulse stressing at the IC pad 1. Accordingly, the internal circuit 2 can be protected by the triggered ESD protection circuit and thus ESD damage is avoided.

Figure 1:
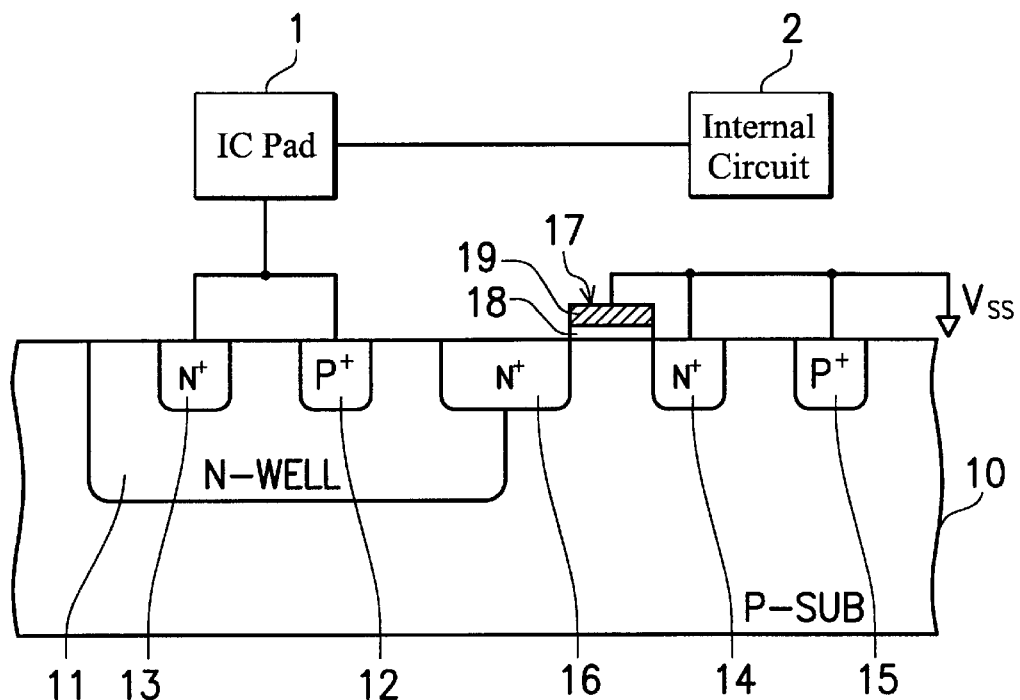
FIG. 1 depicts a cross-sectional view of a conventional lateral silicon-controlled rectifier fabricated onto a semiconductor substrate.
Figure 2:
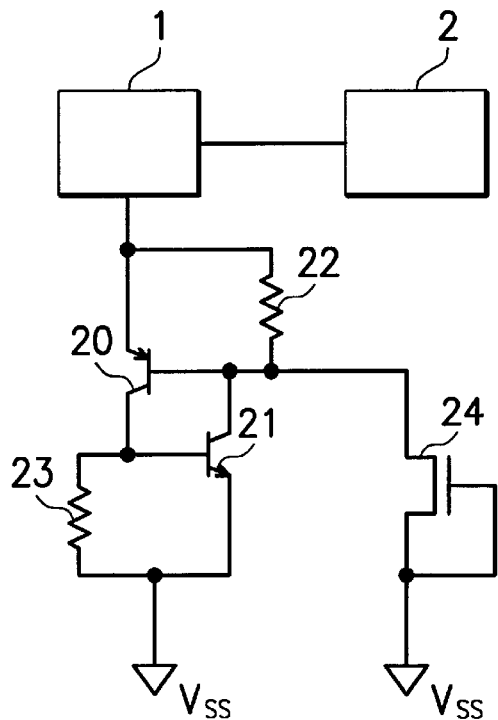
FIG. 2 schematically depicts an equivalent circuit diagram of the conventional lateral silicon-controlled rectifier as shown in FIG. 1.
Figure 10:
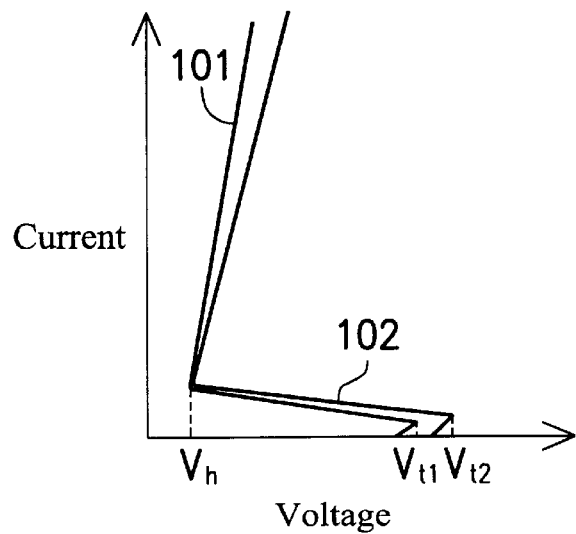
FIG. 10 depicts the I–V characteristics curve of the electrostatic discharge protection circuit in accordance with the present invention with the conventional one used as a comparison.

Referring to FIG. 10, the I–V characteristics curve of the electrostatic discharge protection circuit in accordance with the present invention is depicted, wherein curve 101 represents the I–V curve of the first preferred embodiment shown in FIG. 1 while curve 102 represents the I–V curve of the conventional ESD protection circuit (U.S. Pat. No. 5,465, 189) as a comparison. In FIG. 10, although the holding voltage $V_h$ remains almost the same, the trigger voltage $V_{t1}$ of ESD protection circuit according to the present invention is lower than the trigger voltage $V_{t2}$ of the conventional protection circuit, that is, $V_{t1} < V_{t2}$. In addition, the turn-on conductance (the slope of the I–V curve) of the ESD protection circuit in accordance with the present invention is increased as compared with that of the conventional protection circuit. Therefore, the ESD protection circuit in accordance with the present invention is suitable for deep sub-micron semiconductor integrated circuit fabrication. Moreover, the fact that no contact region is provided in the P-type semiconductor layer 31 greatly reduces the required layout area and further decreases the parasitic capacitance of the IC pad 1.

Figure 5:
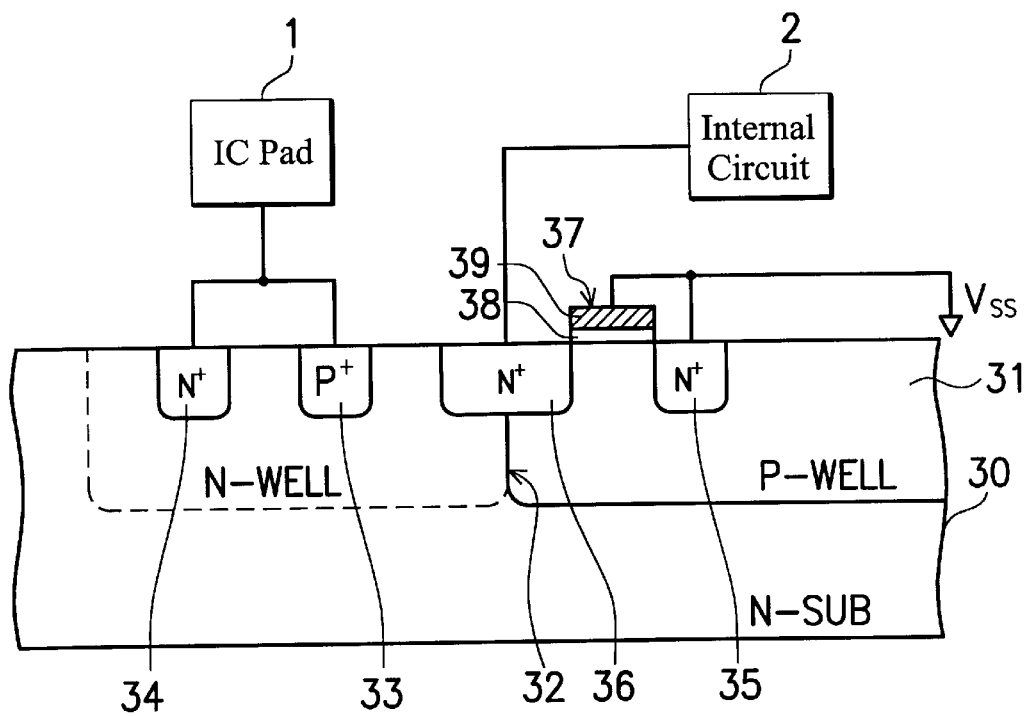
FIG. 5 depicts a cross-sectional view of a second preferred embodiment of the present invention fabricated onto a semiconductor substrate.

Referring to FIG. 5, a cross-sectional view of a second preferred embodiment of the present invention fabricated onto a semiconductor substrate is depicted, wherein the internal circuit 2 is further connected to the third N-type doped region 36.

Figure 6:
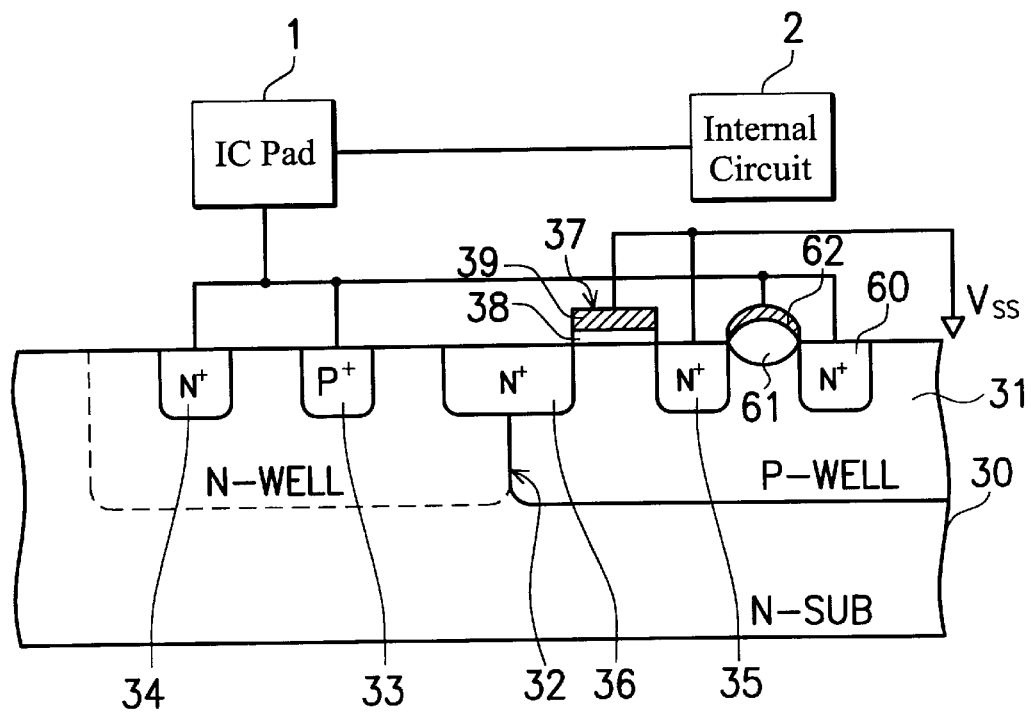
FIG. 6 depicts a cross-sectional view of a third preferred embodiment of the present invention fabricated onto a semiconductor substrate.

Referring to FIG. 6, a cross-sectional view of a third preferred embodiment of the present invention fabricated onto a semiconductor substrate is depicted. In FIG. 6, a field device is further provided in the P-type semiconductor layer 31. The field device is configured with a fourth N-type doped region 60 as one source/drain region and the second N-type doped region 35 as another source/drain region. The fourth N-type doped region 60 and the second N-type doped region 35 are spaced apart by a field oxide 61 on which an electrode layer 62 is formed. The fourth N-type doped region 60 is connected with the electrode layer 62 to the IC pad 1. In accordance with the third preferred embodiment of the present invention, the field device further boosts the potential of the P-type semiconductor layer 31 when an ESD pulse stresses at the IC pad 1 so that the third preferred embodiment has a trigger voltage lower than that of the first preferred embodiment.

Figure 7:
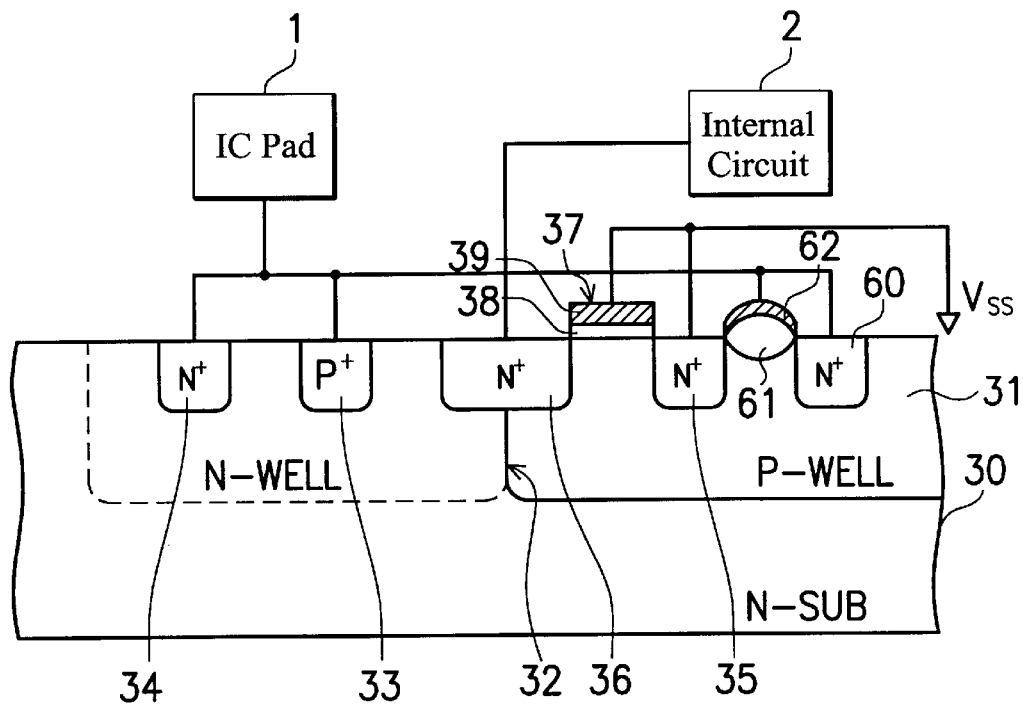
FIG. 7 depicts a cross-sectional view of a fourth preferred embodiment of the present invention fabricated onto a semiconductor substrate.

Referring to FIG. 7, a cross-sectional view of a fourth preferred embodiment of the present invention fabricated onto a semiconductor substrate is depicted, wherein the internal circuit 2 is connected to the third N-type doped region 36, as compared with FIG. 6.

Figure 8:
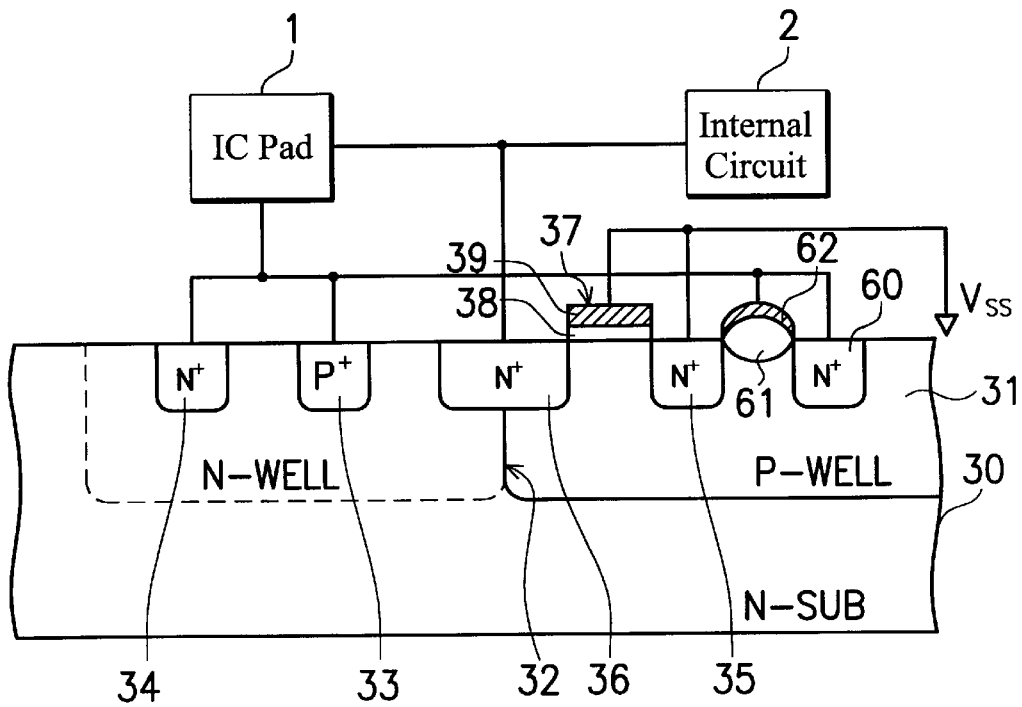
FIG. 8 depicts a cross-sectional view of a fifth preferred embodiment of the present invention fabricated onto a semiconductor substrate.

Referring to FIG. 8, a cross-sectional view of a fifth preferred embodiment of the present invention fabricated onto a semiconductor substrate is depicted, wherein the internal circuit 2 is connected to the IC pad 1 as well as the third N-type doped region 36 to enhance the negative ESD immunity.

Figure 9:
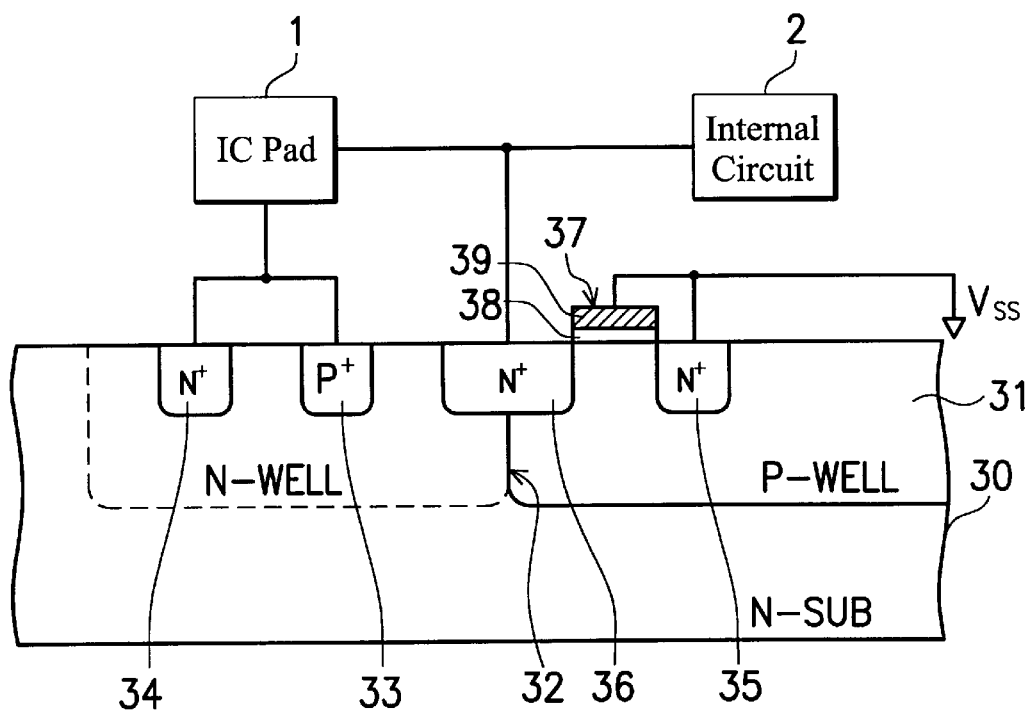
FIG. 9 depicts a cross-sectional view of a sixth preferred embodiment of the present invention fabricated onto a semiconductor substrate.

Referring to FIG. 9, a cross-sectional view of a sixth preferred embodiment of the present invention fabricated onto a semiconductor substrate is depicted, wherein the internal circuit 2 is connected to the IC pad 1 as well as the third N-type doped region 36 to enhance the negative ESD stress immunity as compared with the first preferred embodiment.

While the invention has been described with reference to various illustrative embodiments, the description is not intended to be construed in a limiting sense. Various modifications of the illustrative embodiments, as well as other embodiments of the invention, will be apparent to those person skilled in the art upon reference to this description. It is therefore contemplated that the appended claims will cover any such modifications or embodiments as may fall within the scope of the invention defined by the following claims and their equivalents.

What is claimed is:

1. An electrostatic discharge protection circuit, comprising:
   an N-type semiconductor layer;
   a floating P-type semiconductor layer in contact with said N-type semiconductor layer to establish a junction there between;
   a first P-type doped region formed in said N-type semiconductor layer;
   a first N-type doped region formed in said N-type semiconductor layer and connected with said first P-type doped region to a first node;
   a second N-type doped region formed in said P-type semiconductor layer and connected to a second node;
   a third N-type doped region spanning said junction; and
   a gate structure overlying a portion of said P-type semiconductor layer between said second and third N-type doped regions.

2. The electrostatic discharge protection circuit as claimed in claim 1, wherein said first node is connected to an integrated circuit pad which is connected to an internal circuit.

3. The electrostatic discharge protection circuit as claimed in claim 1, wherein said first node is connected to an integrated circuit pad and said third N-type doped region is connected to an internal circuit.

4. The electrostatic discharge protection circuit as claimed in claim 1, wherein said first node is connected to an integrated circuit pad which is connected to an internal circuit and said third N-type doped region.

5. The electrostatic discharge protection circuit as claimed in claim 1, wherein said gate structure comprises a dielectric layer and an electrode layer connected to said second node.

6. An electrostatic discharge protection circuit, comprising:
   an N-type semiconductor layer;
   a P-type floating semiconductor layer in contact with said N-type semiconductor layer to establish a junction there between;
   a first P-type doped region formed in said N-type semiconductor layer;
   a first N-type doped region formed in said N-type semiconductor layer and connected with said first P-type doped region to a first node;
   a second N-type doped region formed in said P-type semiconductor layer and connected to a second node;
   a third N-type doped region spanning said junction;
   a gate structure overlying a portion of said P-type doped region between said second and third N-type doped regions; and
   a field device formed in said P-type semiconductor layer.

7. The electrostatic discharge protection circuit as claimed in claim 6, wherein said first node is connected to an integrated circuit pad which is connected to an internal circuit.

8. The electrostatic discharge protection circuit as claimed in claim 6, wherein said first node is connected to an integrated circuit pad and said third N-type doped region is connected to an internal circuit.

9. The electrostatic discharge protection circuit as claimed in claim 6, wherein said first node is connected to an integrated circuit pad which is connected to an internal circuit and said third N-type doped region.

10. The electrostatic discharge protection circuit as claimed in claim 6, wherein said gate structure comprises a dielectric layer and an electrode layer connected to said second node.

11. The electrostatic discharge protection circuit as claimed in claim 6, wherein said field device is provided with a gate and one of source/drain regions connected together to said first node.

* * * * *